US012642103B2

(12) United States Patent
Nease et al.

(10) Patent No.: US 12,642,103 B2
(45) Date of Patent: May 26, 2026

(54) SEMICONDUCTOR PACKAGE, BASE STATION, MOBILE DEVICE AND METHOD FOR FORMING A SEMICONDUCTOR PACKAGE

(71) Applicant: Intel Corporation, Santa Clara, CA (US)

(72) Inventors: Ellis Nease, New Tripoli, PA (US); Giacomo Cascio, Villach (AT); Marc Jan Georges Tiebout, Finkenstein (AT)

(73) Assignee: Intel Corporation, Santa Clara, CA (US)

( * ) Notice: Subject to any disclaimer, the term of this patent is extended or adjusted under 35 U.S.C. 154(b) by 96 days.

(21) Appl. No.: 17/809,985

(22) Filed: Jun. 30, 2022

(65) Prior Publication Data

US 2024/0006350 A1 Jan. 4, 2024

(51) Int. Cl.
| | |
|---|---|
| *H10W 44/20* | (2026.01) |
| *H01Q 1/22* | (2006.01) |
| *H10W 70/05* | (2026.01) |
| *H10W 70/65* | (2026.01) |
| *H10W 70/685* | (2026.01) |

(52) U.S. Cl.
CPC .......... *H10W 44/20* (2026.01); *H01Q 1/2283* (2013.01); *H10W 70/05* (2026.01);
(Continued)

(58) Field of Classification Search
CPC . H10W 44/20; H10W 44/212; H10W 44/216; H10W 44/223; H10W 44/234;
(Continued)

(56) References Cited

U.S. PATENT DOCUMENTS

| | | | | |
|---|---|---|---|---|
| 5,969,580 A * | 10/1999 | Maillet | .................... | H01P 5/107 |
| | | | | 333/33 |
| 12,272,857 B2 * | 4/2025 | Maruyama | ............ | H01P 5/1022 |
| 2005/0011674 A1 * | 1/2005 | Oprysko | ................. | H01L 23/66 |
| | | | | 174/262 |
| 2007/0178766 A1 * | 8/2007 | Banerjee | ................ | H05K 1/025 |
| | | | | 439/638 |
| 2009/0152689 A1 * | 6/2009 | Nease | ..................... | H01L 23/66 |
| | | | | 257/E23.079 |
| 2010/0231320 A1 * | 9/2010 | Kawamura | ............. | H01L 23/66 |
| | | | | 257/E21.511 |

(Continued)

*Primary Examiner* — Dao H Nguyen
(74) *Attorney, Agent, or Firm* — 2SPL Patent Attorneys PartG mbB; Yong Beom Hwang

(57) ABSTRACT

A semiconductor package is provided. The semiconductor package includes a semiconductor die arranged within a housing of the semiconductor package. The semiconductor die holds a radio frequency circuit and a plurality of first electrical contacts. Additionally, the semiconductor package includes a plurality of second electrical contacts formed on the exterior of the housing to enable external electrical contacting of the semiconductor package. The semiconductor package further includes a plurality of transmission lines formed in or on a substrate of the semiconductor package. Each of the plurality of transmission lines couples a respective one of the plurality of first electrical contacts with a respective one of the plurality of second electrical contacts. At least one of the plurality of transmission lines is formed as a stepped transmission line transformer comprising a plurality of transmission line segments exhibiting different impedances to match a respective first impedance of the respectively coupled first electrical contact to a respective second impedance at the respectively coupled second electrical contact. The plurality of transmission line segments exhibit different spacings to one or more ground plane of the semiconductor package.

25 Claims, 6 Drawing Sheets

100

(52) U.S. Cl.
CPC ......... *H10W 70/095* (2026.01); *H10W 70/65* (2026.01); *H10W 70/685* (2026.01); *H10W 44/212* (2026.01); *H10W 44/216* (2026.01); *H10W 44/223* (2026.01); *H10W 44/234* (2026.01); *H10W 44/248* (2026.01); *H10W 44/255* (2026.01)

(58) Field of Classification Search
CPC . H10W 44/248; H10W 44/255; H10W 70/05; H10W 70/095; H10W 70/65; H10W 70/685; H01Q 1/2283
See application file for complete search history.

(56) References Cited

U.S. PATENT DOCUMENTS

| | | | | |
|---|---|---|---|---|
| 2012/0263244 | A1* | 10/2012 | Kyles | H01Q 7/00 375/259 |
| 2014/0001643 | A1* | 1/2014 | Kong | H01L 23/528 257/E23.06 |
| 2020/0388926 | A1* | 12/2020 | Maruyama | H01P 1/02 |
| 2021/0328551 | A1* | 10/2021 | Maalouf | H01L 23/66 |
| 2024/0021489 | A1* | 1/2024 | Al Nukari | H01L 23/481 |

* cited by examiner

500

640

630
620
621
610

600

740
730
720
721
710

700

802

804

806

808

800

SEMICONDUCTOR PACKAGE, BASE STATION, MOBILE DEVICE AND METHOD FOR FORMING A SEMICONDUCTOR PACKAGE

BACKGROUND

Impedance matching is an aspect for any Radio Frequency (RF) Input-Output (IO), RF receive or RF transmit device. Typically, the devices are designed to meet certain target impedances such as $50\Omega$ for single-ended devices or $100\Omega$ for differential devices. The devices conventionally target certain characteristics for various parameters such as S11, S22, S11dd or S22dd.

Conventionally, the complete chain from the Printed Circuit Board (PCB) via the package routing of the transmission lines to the chip is specifically designed to meet an identical specified impedance. For chip design this is especially difficult as high-performance RF circuits (e.g. power amplifiers, wideband input buffers, low-noise amplifiers or analog-to-digital drivers, etc.) require large transistor devices with high capacitive parasitics. The problem is further aggravated by additional ElectroStatic Discharge (ESD) protection devices. This often leads to a quite suboptimal compromise between impedance matching, ESD-hardness and circuit performance specifications. In addition, bad impedance matching usually leads to additional insertion loss.

Hence, there may be a demand for improved impedance matching.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
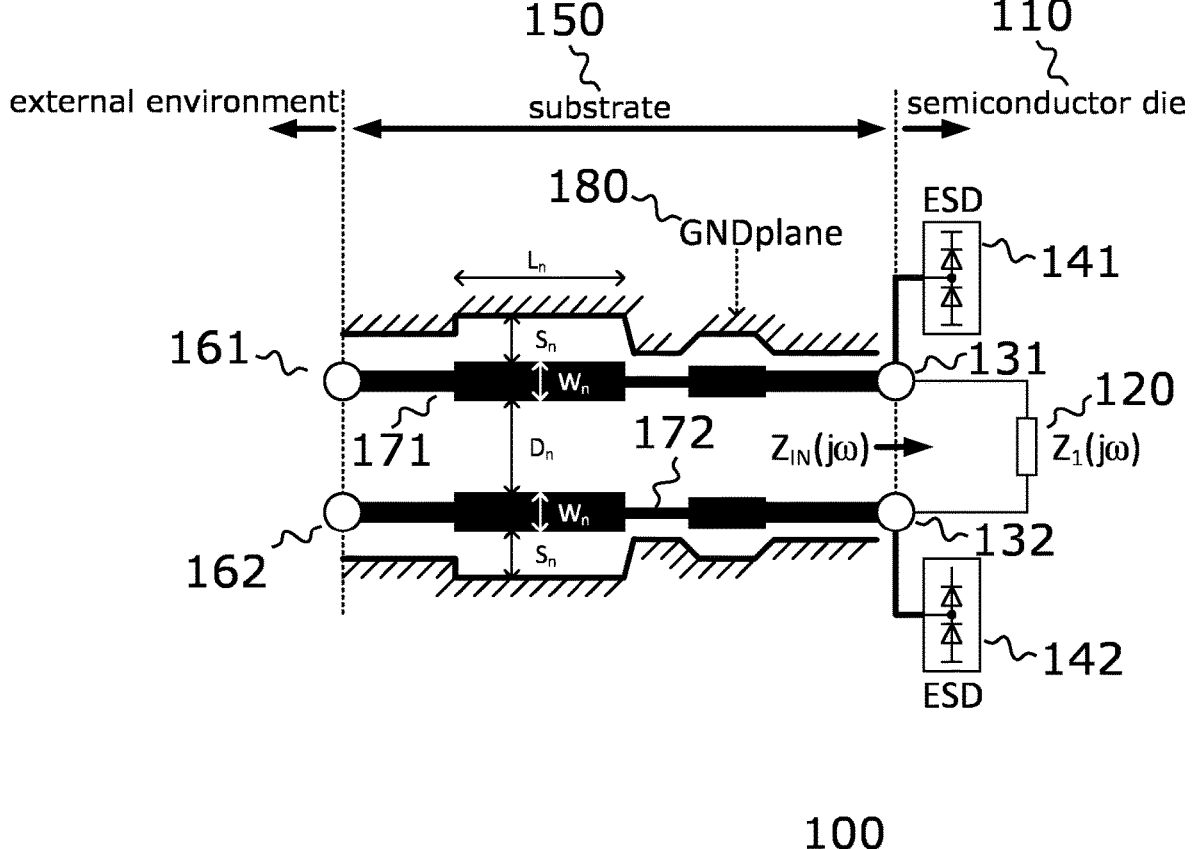
FIG. 1 illustrates an example of a semiconductor package.

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an "or", this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

FIG. 1 illustrates an exemplary semiconductor package 100 according to the proposed technique.

The semiconductor package 100 comprises a semiconductor die 110. The semiconductor die 110 holds (comprises) a RF circuit 120. In the differential example of FIG. 1, the RF circuit 120 is represented by a complex load $Z_1$. The RF circuit 120 is a circuit configured to process one or more RF signal. For example, the RF circuit 120 may be one of a RF transmitter, a RF receiver or a RF transceiver. However, it is to be noted that the RF circuit 120 is not limited to the foregoing examples.

The semiconductor die 110 additionally holds (comprises) a plurality of first electrical contacts. For reasons of clarity, only two first electrical contacts 131 and 132 are illustrated in FIG. 1. However, it is to be noted that the plurality of first electrical contacts may in general comprise any number N≥2 of electrical contacts. For example, the first electrical contacts may be conductive pads or other ohmic contacts on the semiconductor die 110. However, it is to be noted that the first electrical contacts are not limited to the foregoing examples.

In addition to the RF circuit 120, the semiconductor die 110 may optionally hold further (integrated) circuitry. This is exemplarily illustrated in FIG. 1 by the ESD protection circuits 141 and 142 coupled to the first electrical contacts 131 and 132.

The semiconductor die 110 is arranged within a housing of the semiconductor package 100. For reasons of clarity, the housing is not illustrated in FIG. 1. The housing encloses the semiconductor die 110 and the other components of the semiconductor package 100 (e.g. another semiconductor die). For example, the housing may be made of one or more of metal, (epoxy) plastic, silicone, polyimide, glass and ceramic. However, it is to be noted that the housing is not limited to the foregoing exemplary materials.

A plurality of second electrical contacts are formed on the exterior of the housing to enable external electrical contacting of the semiconductor package 110. In other words, the plurality of second electrical contacts are provided for allowing the semiconductor package 110 to be connected (coupled) to the external environment such as, e.g., a PCB or another semiconductor package. For reasons of clarity, only two second electrical contacts 161 and 162 are illustrated in FIG. 1. However, it is to be noted that the plurality of first electrical contacts may in general comprise any number M≥2 of electrical contacts. For example, the second electrical contacts may be leads, solder balls or contact pads provided on the exterior of the housing. However, it is to be noted that the second electrical contacts are not limited to the foregoing examples.

The semiconductor die 110 is held (arranged, mounted) on a substrate 150 of the semiconductor package. The substrate 150 may be made of various materials such as, e.g., resin material, epoxy material and/or polyimide material. The substrate 150 may be a rigid substrate. In other examples, the substrate 150 may be a tape substrate. The substrate 150 may comprise one or more layers of substrate material.

A plurality of transmission lines are formed in or on the substrate 150. For reasons of clarity, only two transmission lines 171 and 172 are illustrated in FIG. 1. However, it is to be noted that the plurality of transmission lines may in general comprise any number K≥2 of transmission lines. In some examples, only one transmission line may be formed in or on the substrate 150 rather than a plurality of transmission lines. The transmission lines are structures designed to conduct electromagnetic waves (energy). For example, the transmission lines may be made of a metal (e.g. copper) and at least in part be formed as microstrip lines. Each of the plurality of transmission lines couples a respective one of the plurality of first electrical contacts with a respective one of the plurality of second electrical contacts. In the example of FIG. 1, the transmission line 171 couples the first electrical contact 131 with the second electrical contact 161, and the transmission line 172 couples the first electrical contact 132 with the second electrical contact 162. The plurality of transmission lines and the semiconductor die 110 are formed as separate elements. In other words, the plurality of transmission lines are not part of the semiconductor die 110. The plurality of transmission lines merely contact the first electrical contacts of the semiconductor die 110.

In the example of FIG. 1, the transmission lines 171 and 172 are formed as a respective stepped (staggered) transmission line transformer comprising a plurality of transmission line segments exhibiting different impedances to match a respective first impedance of the respectively coupled first electrical contact to a respective second impedance at the respectively coupled second electrical contact. In other words, the transmission line 171 is formed as a stepped transmission line transformer comprising a plurality of transmission line segments exhibiting different impedances to match a first impedance of the coupled first electrical contact 131 to a second impedance at the coupled second electrical contact 161. Analogously, the transmission line 172 is formed as a stepped transmission line transformer comprising a plurality of transmission line segments exhibiting different impedances to match a first impedance of the coupled first electrical contact 132 to a second impedance at the coupled second electrical contact 162.

In the example of FIG. 1, all of the transmission lines are formed as stepped transmission line transformers. However, it is to be noted that the present disclosure is not limited thereto. In general, at least one of the plurality of transmission lines is formed as a stepped transmission line transformer. That is, one or more of the plurality of transmission lines are respectively formed as a stepped transmission line transformer. In case only one transmission line is formed in or on the substrate 150, the one transmission line is formed as a stepped transmission line transformer.

In the example of FIG. 1, each of the transmission lines 171 and 172 comprises five transmission line segments. However, it is to be noted that the present disclosure is not limited thereto. In general, each of the plurality of transmission lines may comprise any number B≥2 of transmission line segments. The individual transmission lines of the plurality of transmission lines may each comprise the same number of transmission line segments or different numbers of transmission line segments.

Further illustrated in FIG. 1 is a ground plane 180 of the semiconductor package 100. The ground plane 180 may, e.g., be formed in or on the substrate 150. The ground plane is an electrically conductive plane (surface), which is coupled (connected) to ground, when the semiconductor package 100 is coupled to ground via one or more of the second electrical contacts. As can be seen from FIG. 1, the plurality of transmission line segments of each of the transmission lines 171 and 172 exhibit different spacings $S_n$ to the ground plane 180. In general, the semiconductor package 100 or the substrate 150 may comprise further ground planes. Accordingly, the plurality of transmission line segments exhibit different spacings to the one or more ground plane of the semiconductor package 100.

The one or more transmission line formed as stepped transmission line transformers allow to implement an impedance transformation network between the semiconductor die 110 and the external environment. Accordingly, the requirements for the circuitry on the semiconductor die 110 may be relaxed. According to the present disclosure, one or more of the otherwise unused transmission lines in the package substrate are converted into a matching network at substantially no additional cost to improve the performance of the semiconductor package 100. In particular, improved impedance matching at the interface to the external environment and/or lower insertion loss may be achieved. Forming an impedance transformation network by means of the one or more transmission lines in or on the package substrate 150 is much cheaper than forming an impedance transformation network in the semiconductor die 110 as no dedicated mask set for the semiconductor manufacturing is needed. The semiconductor package 100 may be tailored to various applications or various frequency ranges using the same semiconductor die 110 by adapting the one or more transmission lines. In other examples, the impedance matching by means of the one or more transmission line may allow to slightly modify an existing semiconductor die, e.g., enable a relatively cheap higher metal redesign.

Furthermore, co-design of the semiconductor package 100 and the semiconductor die 110 may be enabled. For example, in case the package engineering is available at an early design phase of the semiconductor die 110, it may be used to optimize critical circuit performances on the semiconductor die 110 at the cost of worse impedance matching performance on the semiconductor die 110. The worse impedance matching performance may be compensated by an according layout of the one or more transmission line in or on the package substrate 150. For example, an output power amplifier on the semiconductor die 110 may be optimized for better output power and efficiency at the cost of a compromised output reflection coefficient (S22-parameter) of the semiconductor die 110 as the overall output reflection coefficient (S22-parameter) of the semiconductor package 100 (i.e. semiconductor die+the stepped transmission lines) may meet target performance due to the impedance matching by means of the one or more transmission lines.

The variation of the spacings $S_n$ to the ground plane 180 for the plurality of transmission line segments is a parameter that allows to adjust the respective impedance of each transmission line segment. Optionally, further parameters may be adjusted to tune the respective impedance of each transmission line segment. For example, the plurality of transmission line segments may further exhibit at least one of different lengths $L_n$, different widths $W_n$ and different spacings $D_n$ to one or more neighboring transmission line of the plurality of transmission lines. In the example of FIG. 1, in addition to the spacings $S_n$ to the ground plane 180, the lengths $L_n$ and the widths $W_n$ of the individual transmission line segments of the transmission lines 171 and 172 as well as the spacings $D_n$ between neighboring transmission line segments of the transmission lines 171 and 172 are varied to adjust the impedances of the individual transmission line segments so as to match a respective first impedance of the respectively coupled first electrical contact 131, 132 to a respective second impedance at the respectively coupled second electrical contact 161, 162.

For example, if the semiconductor package 100 is implemented single-ended, the respective second (target) impedance at the second electrical contact may be 50Ω. In this case, the transmission lines 171 and 172 illustrated in FIG. 1 may, e.g., be used to transmit different signals (e.g. an output signal of the RF circuit and an input signal for the RF circuit) to or from the semiconductor die 100. If the semiconductor package 100 is implemented differentially, the respective second (target) impedance at the second electrical contact may be 100Ω. In this case, the transmission lines 171 and 172 illustrated in FIG. 1 may, e.g., be used to transmit a differential signal pair (e.g. a differential output signal pair of the RF circuit or a differential input signal for the RF circuit) to or from the semiconductor die 100. In both cases, conventionally expected target impedances may be provided by the semiconductor package 100 at the second electrical contacts.

It is to be noted that the proposed impedance matching by means of the one or more stepped transmission line transformers may be used for input signals to the RF circuit as well as for output signals of the RF circuit. For example, at least one of the plurality of first electrical contacts (e.g. the first electrical contact 131) may be coupled to input circuitry of the RF circuit, wherein the respectively coupled transmission line (e.g. the transmission line 171) is used to transmit an input signal for the RF circuit, which is received at the respectively coupled second electrical contact (e.g. the second electrical contact 161), to the semiconductor die 100. Analogously, at least one of the plurality of first electrical contacts (e.g. the first electrical contact 132) may be coupled to output circuitry of the RF circuit, wherein the respectively coupled transmission line (e.g. the transmission line 172) is used to transmit an output signal of the RF circuit, which is output at the respectively coupled first electrical (e.g. the first electrical contact 132) of the semiconductor die 100, to the respectively coupled second electrical contact (e.g. the second electrical contact 162).

In the example of FIG. 1, the transmission lines 171 and 172 are arranged on the substrate 150. However, the present disclosure is not limited thereto. In other examples, at least part of the plurality of transmission lines may be arranged in (inside, within) the substrate of the semiconductor package. In still other examples, the plurality of transmission lines may be fully arranged in the substrate of the semiconductor package.

Figure 2:
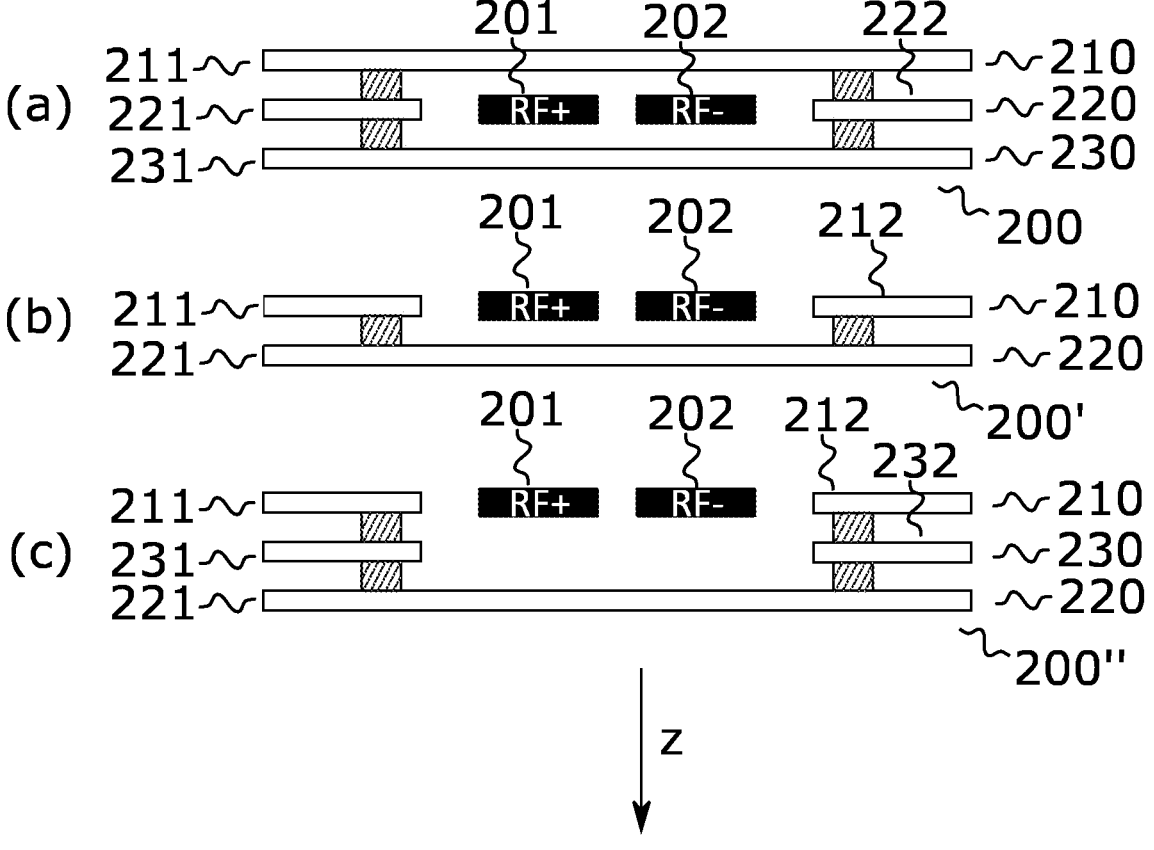
FIG. 2 illustrates cross sections through exemplary substrates.

FIG. 2 illustrates in its subfigures (a) to (c) three exemplary arrangements of two transmission lines 201 and 202 in or on the substrate. The transmission lines 201 and 202 may be used for transmitting a differential signal pair as indicated in subfigures (a) to (c). However, the present disclosure is not limited thereto. In other examples, the transmission lines 201 and 202 may be used to transmit single-ended signals. Furthermore, it is to be noted that the number of transmission lines in each of subfigures (a) to (c) is selected merely for clarity. More or less transmission lines may be provided according to further examples.

In the example of subfigure (a), the substrate 200 is a multilayered substrate comprising at least a first layer 210, a second layer 220 and a third layer 230. The first layer 210, the second layer 220 and the third layer 230 are arranged subsequently along a thickness direction z of the substrate 200. The second layer 220 is arranged between the first layer 210 and the third layer 230 along the thickness direction z of the substrate 200.

A first ground plane 211 is formed in the first layer 210. Two second ground planes 221 and 222 are formed in the second layer 220. A third ground plane 231 is formed in the third layer 230. The two transmission lines 201 and 202 are formed in the second layer 220 laterally adjacent between the two second ground planes 221 and 222.

In the example of subfigure (a), the transmission lines 201 and 202 are surrounded (boxed) by ground planes. This may enable improved isolation of the transmission lines 201 and 202 against other input and/or output lines. In some examples, a single ground plane may be formed in the second layer 220 instead of the two ground planes 221 and 222. In other words, at least one transmission line may be formed in the second layer 220 laterally adjacent to one or more second ground plane formed in the second layer.

Also the substrate 200' illustrated in subfigure (b) is a multilayered substrate and comprises at least a first layer 210 and a second layer 220. The first layer 220 is a surface layer of the substrate 200'. Two first ground planes 211 and 212 are formed in the first layer 210 at a surface of the substrate 200'. The two transmission lines 201 and 202 are formed in the first layer 210 laterally adjacent between the two first ground planes 211 and 212. A second ground plane 221 is formed in the second layer 220.

The multilayered substrate 200'' illustrated in subfigure (c) comprises an additional third layer 230, which is arranged between the first layer 210 and the second layer 220. Two third ground planes 231 and 232 are formed in the third layer 230. The third ground planes 231 and 232 are separated from each other such that the third ground planes 231 and 232 do not extended below the transmission lines 201 and 202.

In the above examples, the transmission lines are routed in a respective single layer of the package substrate. However, the present disclosure is not limited thereto. According to examples of the present disclosure, part of the transmission lines may also be routed along the thickness direction of the substrate. This is exemplarily illustrated in FIG. 3 and FIG. 4.

Figure 3:
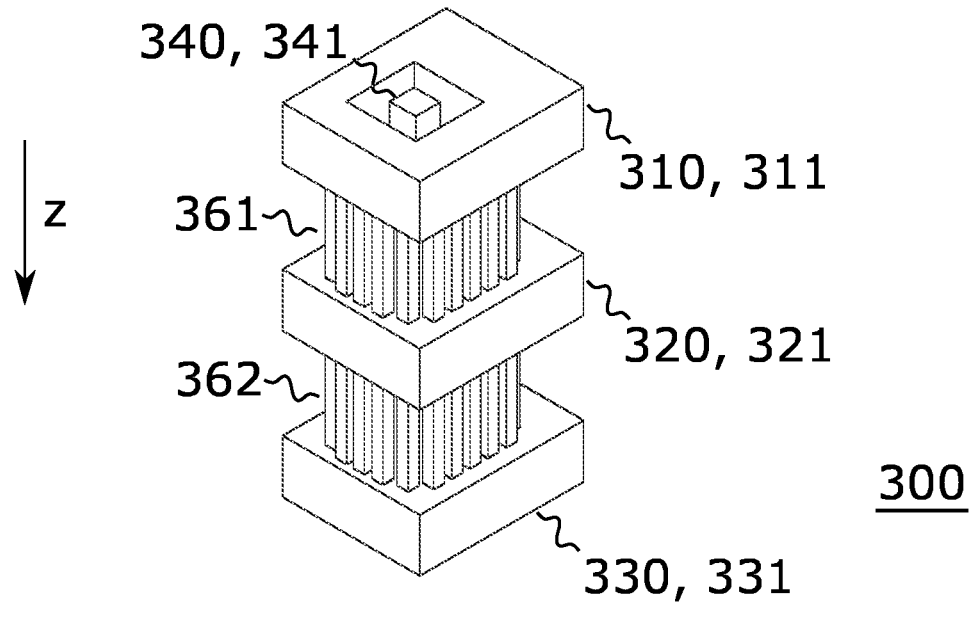
FIG. 3 and FIG. 4 illustrates an exemplary substrate with ground planes coupled by arrays of ground vias.
Figure 4:
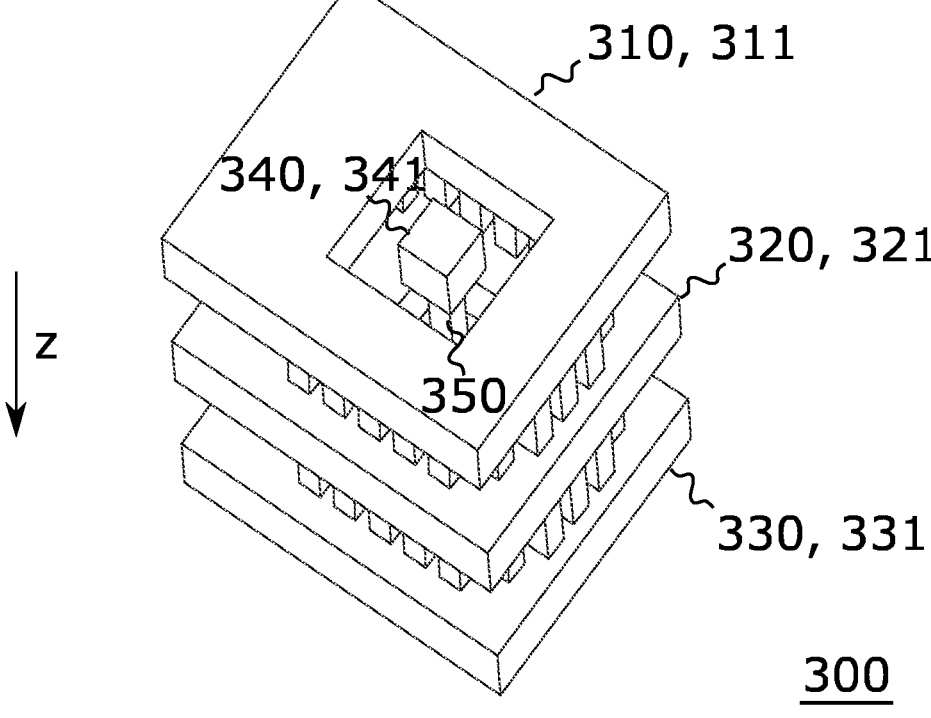

FIG. 3 illustrates an exemplary multilayered substrate 300 with at least the three layers 310, 320 and 330 arranged subsequently along the thickness direction z of the substrate 300. FIG. 4 is another perspective view of the multilayered substrate 300. A first ground plane 311 is formed in the first layer 310. A second ground plane 321 is formed in the second layer 320. A third ground plane 331 is formed in the third layer 330.

A transmission line segment 341 of a transmission line 340 extends along the thickness direction z of the substrate 300. In other words, the transmission line segment 341 of the transmission line 340 is routed along the thickness direction z of the substrate 300. That is, an extension of the transmission line segment 341 along the thickness direction is at least two, three, five, ten or 15 times larger than an extension of the transmission line segment 341 perpendicular to the thickness direction z of the substrate 300 (i.e. along a lateral direction of the substrate 300). It is to be noted that more than one transmission line segment of the transmission line 340 may be routed along the thickness direction z of the substrate 300.

According to the present disclosure, a transmission line may comprise transmission line segments routed perpendicular to the thickness direction of the substrate as illustrated in FIG. 1 or FIG. 2 and transmission line segments routed along the thickness direction of the substrate as illustrated in FIG. 3. In other words, according to examples of the present disclosure, at least one of the plurality of transmission line segments of a transmission line may be routed perpendicular to a thickness direction of the substrate, and at least one of the plurality of transmission line segments may be routed along the thickness direction of the substrate. For example, the one or more transmission line segment of the transmission line 340 routed perpendicular to the thickness direction z of the substrate 300 may connect to the upper end of transmission line segment 341.

In the example of FIG. 3 and FIG. 4, a via 350 is coupled to the transmission line segment 341 of the transmission line 340. The via 350 couples the transmission line 340 and the coupled second electrical contact (not illustrated in FIG. 3 and FIG. 4). The via 350 is routed along the thickness direction of the substrate 300 between the transmission line segment 341 and the coupled second electrical contact.

The via 350 and the transmission line segment 341 extend through a respective recess in the ground planes 311, 321 and 331. The ground planes 311, 321 and 331 are coupled via a respective array of ground vias 361, 362 such that the via 350 and the at least one transmission line segment 341 extend through the arrays of ground vias 361 and 362. In other words, the via 350 and the at least one transmission line segment 341 routed along the thickness direction z of the substrate 300 extend through the respective array of ground vias 361 and 362 and a respective recess in the ground planes 311, 321 and 331.

In the example of FIG. 3 and FIG. 4, three ground planes 311, 321 and 331 together with two arrays of ground vias 361 and 362 are illustrated. However, it is to be noted that the present disclosure is not limited thereto. In general any number $G \geq 2$ of ground planes together with a corresponding number of arrays of ground vias (e.g. $G-1$ arrays of ground vias) may be used. Furthermore, it is to be noted that more than one transmission line and more than one via may be routed along the thickness direction of the substrate to extend through a single recess in a ground plane and a single array of ground vias.

Figure 5:
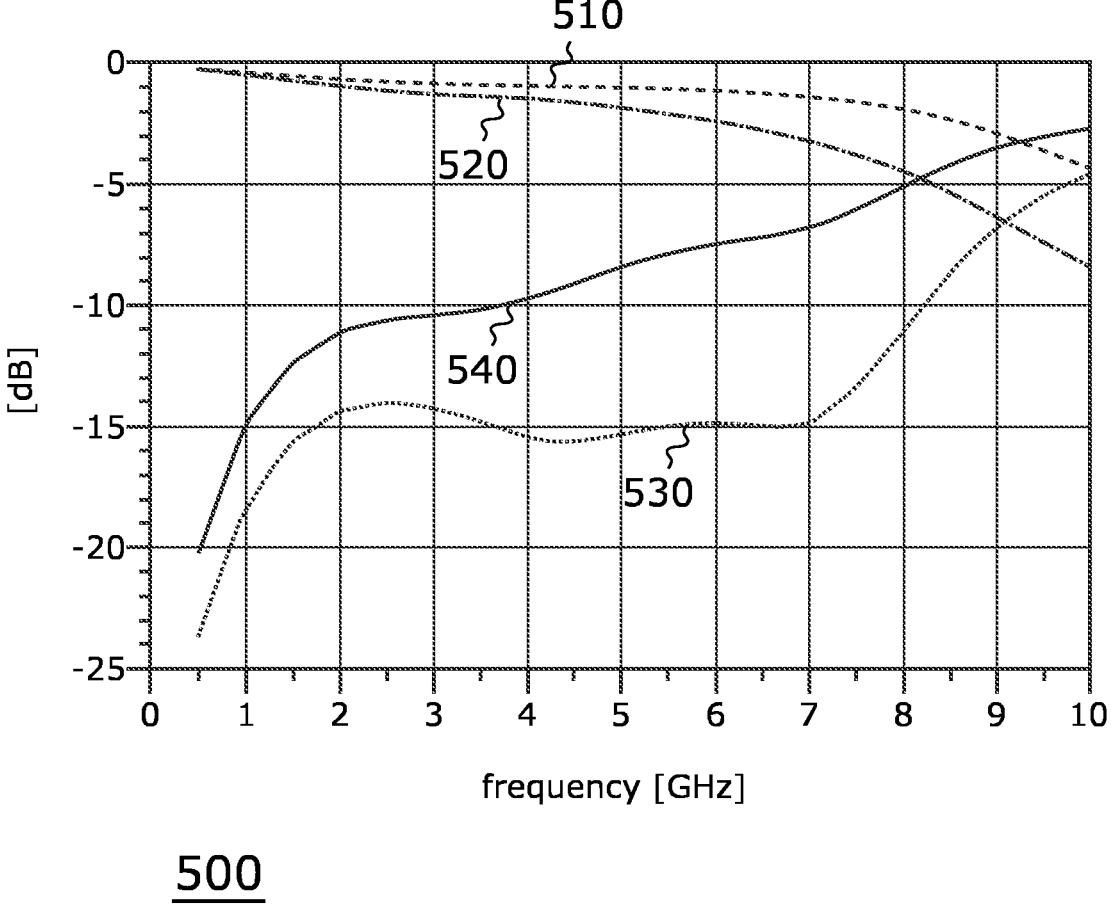
FIG. 5 illustrates exemplary comparisons for output reflection and forward gain.

The effect of the improved impedance matching according to the proposed technique can be seen from FIG. 5. FIG. 5 illustrates a diagram 500. The abscissa denotes the frequency of a signal in GHz. The ordinate is in units of dB.

Curve 510 represents the course of the S21-parameter over the frequency range at one of the optimized stepped transmission lines in a semiconductor package according to the proposed technique. As a reference, line 520 represents the course of the S21-parameter over the frequency range at a non-stepped transmission line in a conventional semiconductor package. The S21-parameter represents the forward gain of the respective transmission line. As can be seen from the comparison of the curves 510 and 520, the power transfer at the impedance matched transmission line of the semiconductor package according to the proposed technique is significantly improved compared to the conventional transmission line due to the individually adapted impedances of the transmission line segments.

Curve 530 represents the course of the S22-parameter over the frequency range at the optimized stepped transmission line in the semiconductor package according to the proposed technique. As a reference, curve 540 represents the course of the S22-parameter over the frequency range at the non-stepped transmission line in the conventional semiconductor package. The S22-parameter represents the output reflection coefficient of the respective transmission line. As can be seen from the comparison of the curves 530 and 540, the insertion loss at the impedance matched transmission line of the semiconductor package according to the proposed technique is significantly reduced compared to the conventional transmission line due to the individually adapted impedances of the transmission line segments.

As can be seen from FIG. 5, a semiconductor package according to the proposed technique may exhibit improved impedance matching at the interface to external (e.g. to a PCB) and lower insertion loss.

Figure 6:
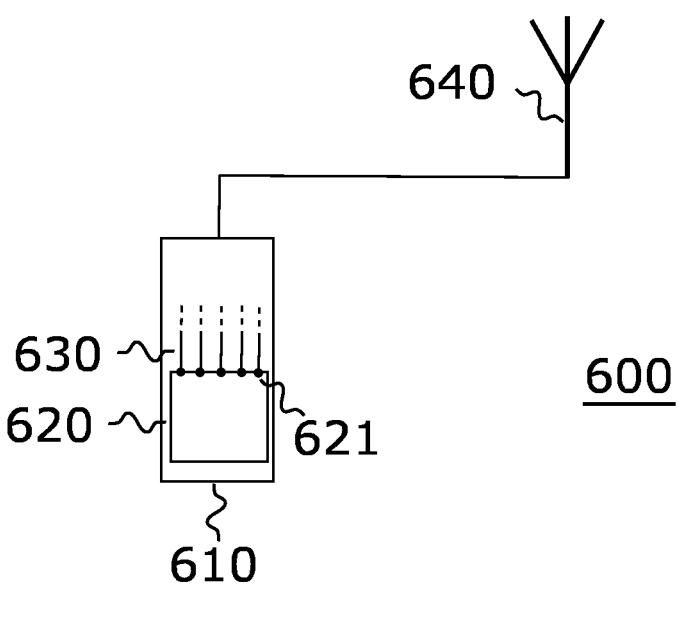
FIG. 6 illustrates an example of a base station.

An example of an implementation using a semiconductor package according to one or more aspects described above in connection with FIGS. 1 to 5 or one or more examples described above in connection with FIGS. 1 to 5 is illustrated in FIG. 6. FIG. 6 schematically illustrates an example of a radio base station 600 (e.g. for a femtocell, a picocell, a microcell or a macrocell) comprising a semiconductor package 620 as proposed.

The base station 600 comprises a PCB 610. The PCB 610 holds the semiconductor package 620. A plurality of electrically conductive traces 630 (e.g. made of a metal such as copper or another electrically conductive material) are formed in or on the PCB 610. The plurality of second electrical contacts 621 of the semiconductor package 620 are coupled to the conductive traces 630. The conductive traces couple the second electrical contacts 621 and, hence, the semiconductor package 620 with further elements on or off the PCB 610. For example, the conductive traces 630 couple the semiconductor package 620 to at least one antenna element 640 of the base station 600, which is external of the PCB 610. The semiconductor package 620 may be coupled to the antenna element 640 via one or more intermediate element such as a Low-Noise Amplifier (LNA), a Power Amplifier (PA), a filter, a down- and/or up-converter (mixer), an attenuator etc. The PCB 610 may hold one or more of these intermediate elements. Accordingly, some these intermediate elements may be arranged off the PCB 610 (e.g. on another PCB of the base station 600).

The RF circuit of the semiconductor package 620 may, e.g., be a RF transmitter configured to generate one or more RF transmit signal for radiation to the environment. Accordingly, the one or more RF transmit signal may be output by one or more of the plurality of second electrical contacts 621 to the conductive traces 630 and be supplied to the at least one antenna element 640 or another antenna element (not illustrated) of the base station 600 via the conductive traces 630. For example, a (e.g. digital) baseband transmit signal may be supplied from a baseband processor of the base station 600 to the semiconductor package 620 via the conductive traces 630, and the RF transmitter may generate the RF transmit signal based on the baseband transmit signal. In other examples, the RF circuit of the semiconductor package 620 may be a RF receiver. In this case, an RF receive signal may be received from the environment by the at least one antenna element 640 or another antenna element (not illustrated) of the base station 600, and be supplied to the semiconductor package 620 via the conductive traces 630. The RF receiver may accordingly be configured to process (e.g. amplify, filter, down-convert, digitize) the RF receive signal. For example, the RF receiver may be configured to generate a (e.g. digital) baseband receive signal based on the RF receive signal. The baseband receive signal may be output via one of the second electrical contacts 621 and transmitted to further circuitry such as a baseband processor of the base station 600 via the conductive traces 630. In still other examples, the RF circuit of the semiconductor package 620 may be a RF transceiver comprising the above described functionalities of both the RF transmitter and the RF receiver.

To this end, a base station with improved impedance matching and/or lower insertion loss at the interface between the PCB and the semiconductor package may be provided.

The base station 600 may comprise further elements such as, e.g., an application processor, memory, a network controller, a user interface, power management integrated circuitry, a satellite navigation receiver, a network interface controller or power tee circuitry. The PCB 610 may hold one or more of these elements. For example, one or more of these elements may be implemented on a semiconductor die of the semiconductor package 620.

In some aspects, the application processor may include one or more Central Processing Unit CPU cores and one or more of cache memory, a Low-DropOut (LDO) voltage regulator, interrupt controllers, serial interfaces such as Serial Peripheral Interface (SPI), Inter-Integrated Circuit ($I^2C$) or universal programmable serial interface module, Real Time Clock (RTC), timer-counters including interval and watchdog timers, general purpose Input-Output (IO), memory card controllers such as Secure Digital (SD)/MultiMedia Card (MMC) or similar, Universal Serial Bus (USB) interfaces, Mobile Industry Processor Interface Alliance (MIPI) interfaces and Joint Test Access Group (JTAG) test access ports.

In some aspects, the baseband processor may be implemented, for example, as a solder-down substrate including one or more integrated circuits, a single packaged integrated circuit soldered to a main circuit board or a multi-chip module containing two or more integrated circuits.

In some aspects, the memory may include one or more of volatile memory including Dynamic Random Access Memory (DRAM) and/or Synchronous Dynamic Random Access Memory (SDRAM), and Non-Volatile Memory (NVM) including high-speed electrically erasable memory (commonly referred to as Flash memory), Phase change Random Access Memory (PRAM), Magnetoresistive Random Access Memory (MRAM) and/or a three-dimensional crosspoint (3D XPoint) memory. The memory may be implemented as one or more of solder down packaged integrated circuits, socketed memory modules and plug-in memory cards.

In some aspects, the power management integrated circuitry may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, the power tee circuitry may provide for electrical power drawn from a network cable to provide both power supply and data connectivity to the base station using a single cable.

In some aspects, the network controller may provide connectivity to a network using a standard network interface protocol such as Ethernet. Network connectivity may be provided using a physical connection which is one of electrical (commonly referred to as copper interconnect), optical or wireless.

In some aspects, the satellite navigation receiver module may include circuitry to receive and decode signals transmitted by one or more navigation satellite constellations such as the Global Positioning System (GPS), GLObalnaya NAvigatSionnaya Sputnikovaya Sistema (GLONASS), Galileo and/or BeiDou. The receiver may provide data to the application processor which may include one or more of position data or time data. The application processor may use time data to synchronize operations with other radio base stations.

In some aspects, the user interface may include one or more of physical or virtual buttons, such as a reset button, one or more indicators such as Light Emitting Diodes (LEDs) and a display screen.

Figure 7:
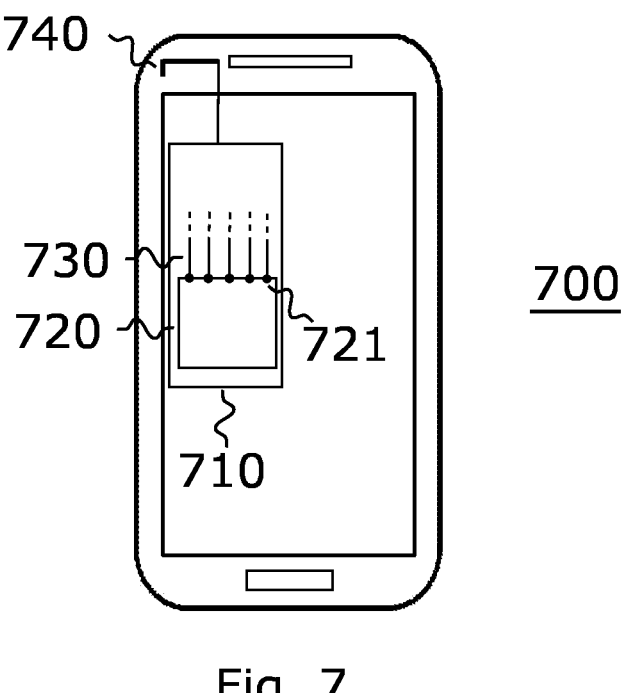
FIG. 7 illustrates an example of a mobile device.

Another example of an implementation using a semiconductor package according to one or more aspects described above in connection with FIGS. 1 to 5 or one or more examples described above in connection with FIGS. 1 to 5 is illustrated in FIG. 7. FIG. 7 schematically illustrates an example of a mobile device 700 (e.g. mobile phone, smartphone, tablet-computer, or laptop) comprising a semiconductor package 720 as proposed.

The mobile device 700 comprises a PCB 710. The PCB 710 holds the semiconductor package 720. A plurality of electrically conductive traces 730 are formed in or on the PCB 710. The plurality of second electrical contacts 721 of the semiconductor package 720 are coupled to the conductive traces 730. The conductive traces couple the second electrical contacts 721 and, hence, the semiconductor package 720 with further elements on or off the PCB 710. For example, the conductive traces 730 couple the semiconductor package 720 to at least one antenna element 740 of the mobile device 700, which is external of the PCB 710. The semiconductor package 720 may be coupled to the antenna element 740 via one or more intermediate element such as a LNA, a PA, a filter, a down- and/or up-converter (mixer), an attenuator etc. The PCB 710 may hold one or more of these intermediate elements. Accordingly, some these intermediate elements may be arranged off the PCB 710 (e.g. on another PCB of the mobile device 700).

The RF circuit of the semiconductor package 720 may, e.g., be a RF transmitter configured to generate one or more RF transmit signal for radiation to the environment. Accordingly, the one or more RF transmit signal may be output by one or more of the plurality of second electrical contacts 721 to the conductive traces 730 and supplied to the at least one antenna element 740 or another antenna element (not illustrated) of the mobile device 700 via the conductive traces 730. For example, a (e.g. digital) baseband transmit signal may be supplied from a baseband processor of the mobile device 700 to the semiconductor package 720 via the conductive traces 730, and the RF transmitter may generate the RF transmit signal based on the baseband transmit signal. In other examples, the RF circuit of the semiconductor package 720 may be a RF receiver. In this case, an RF receive signal may be received from the environment by the at least one antenna element 740 or another antenna element (not illustrated) of the mobile device 700, and be supplied to the semiconductor package 720 via the conductive traces 730. The RF receiver may accordingly be configured to process (e.g. amplify, filter, down-convert, digitize) the RF receive signal. For example, the RF receiver may be configured to generate a (e.g. digital) baseband receive signal based on the RF receive signal. The baseband receive signal may be output via one of the second electrical contacts 721 and transmitted to further circuitry such as a baseband processor of the mobile device 700 via the conductive traces 730. In still other examples, the RF circuit of the semiconductor package 720 may be a RF transceiver comprising the above described functionalities of both the RF transmitter and the RF receiver.

To this end, a mobile device with improved impedance matching and/or lower insertion loss at the interface between the PCB and the semiconductor package may be provided.

The mobile device 700 may comprise further elements such as, e.g., memory, a connectivity module, a Near Field Communication (NFC) controller, an audio driver, a camera driver, a touch screen, a display driver, sensors, removable memory, a power management integrated circuit or a smart battery. The PCB 710 may hold one or more of these elements. For example, one or more of these elements may be implemented on a semiconductor die of the semiconductor package 720.

In some aspects, the application processor may include, for example, one or more CPU cores and one or more of cache memory, LDO regulators, interrupt controllers, serial interfaces such as SPI, I²C or universal programmable serial interface module, RTC, timer-counters including interval and watchdog timers, general purpose input-output (IO), memory card controllers such as SD/MMC or similar, USB interfaces, MIPI interfaces and JTAG test access ports.

In some aspects, the baseband processor may be implemented, for example, as a solder-down substrate including one or more integrated circuits, a single packaged integrated circuit soldered to a main circuit board, and/or a multi-chip module containing two or more integrated circuits.

The wireless communication circuits using a semiconductor package according to the proposed architecture or one or more of the examples described above may be configured to operate according to one of the 3rd Generation Partnership Project (3GPP)-standardized mobile communication networks or systems. The mobile or wireless communication system may correspond to, for example, a 5$^{th}$ Generation New Radio (5G NR), a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM), an Enhanced Data rates for GSM Evolution (EDGE) network, or a GSM/EDGE Radio Access Network (GERAN). Alternatively, the wireless communication circuits may be configured to operate according to mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

Figure 8:
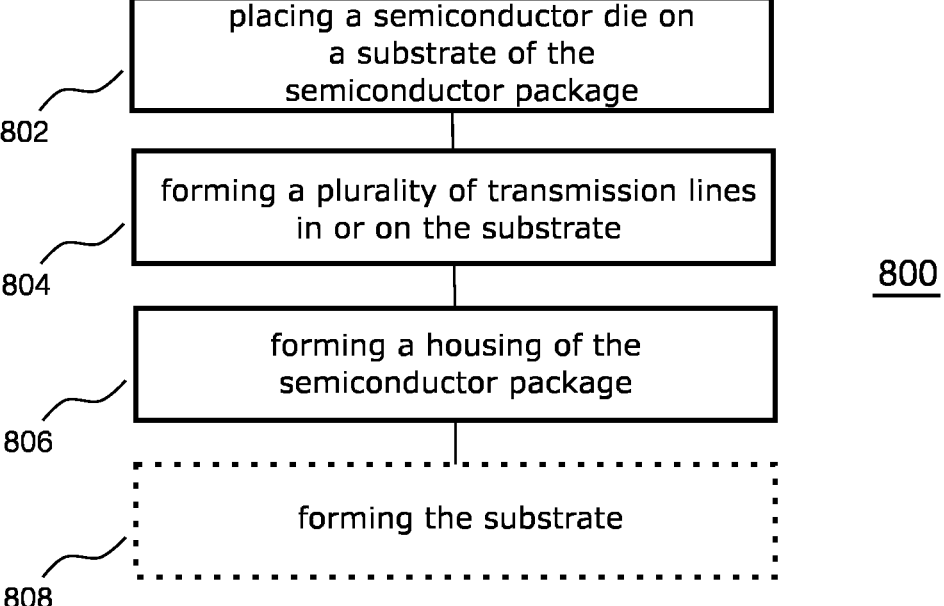
FIG. 8 illustrates flowchart of an example of a method for forming a semiconductor package.

For further illustrating the semiconductor package described above, FIG. 8 illustrates a flowchart of a method 800 for forming a semiconductor package. The method 800 comprises placing (arranging) 802 a semiconductor die on a substrate of the semiconductor package. The semiconductor die comprises a RF circuit and a plurality of first electrical contacts. Additionally, the method 800 comprises forming (generating) 804 a plurality of transmission lines in or on the substrate to couple a respective one of the plurality of first electrical contacts with a respective one of a plurality of second electrical contacts. At least one of the plurality of transmission lines is formed as a stepped transmission line transformer comprising a plurality of transmission line segments exhibiting different impedances to match a respective first impedance of the respectively coupled first electrical contact to a respective second impedance at the respectively coupled second electrical contact. The plurality of transmission line segments are formed to exhibit different spacings to one or more ground plane of the semiconductor package. The method 800 further comprises forming 806 a housing of the semiconductor package to include the second electrical contacts on the exterior of the housing to enable external electrical contacting of the semiconductor package.

The method 800 may allow to form semiconductor packages with improved impedance matching at the interface to external (e.g. such as a PCB) and/or lower insertion loss.

More details and aspects of the method 800 are explained in connection with the proposed technique or one or more examples described above (e.g. FIGS. 1 to 7). The method 800 may comprise one or more additional optional features corresponding to one or more aspects of the proposed technique or one or more examples described above.

For example, the plurality of transmission line segments may additionally be formed to exhibit at least one of different lengths, different widths and different spacings to one or more neighboring transmission line of the plurality of transmission lines. Varying one or more of the above parameters may allow to adjust the impedance to the respective transmission line segment as needed.

Similar to what is described above for the semiconductor package 100, all of the plurality of transmission lines may be formed as stepped transmission line transformers in the method 800. Accordingly, a plurality of impedance matched transmission lines for various input and/or output signals may be provided.

In some examples, the method 800 further comprises forming 808 the substrate as a multilayered substrate comprising at least a first layer, a second layer and a third layer. A first ground plane is formed in the first layer. Forming 804 the plurality of transmission lines in or on the substrate accordingly comprises forming the at least one of the plurality of transmission lines in the second layer laterally adjacent to one or more second ground plane formed in the second layer. A third ground plane is formed in the third layer, wherein the second layer is arranged between the first layer and the third layer.

The method 800 may further comprise calculating the lengths, the widths, the spacings to the one or more neighboring transmission line of the plurality of transmission lines, and the spacings to the one or more ground plane of the semiconductor package for the plurality of transmission line segments based on target values for the respective first impedance and the respective second impedance. Accordingly, the dimensions and the placement of the plurality of transmission line segments may be adjusted such that the impedances provided by the respective transmission line match the target values for the respective first impedance and the respective second impedance.

For example, one or more optimization algorithm may be used for calculating the lengths, the widths, the spacings to one or more neighboring transmission line of the plurality of transmission lines, and the spacings to one or more ground plane of the semiconductor package for the plurality of transmission line segments. The optimization algorithm may be based on mathematical relations between the impedances provided by the respective transmission line match and the lengths, the widths, the spacings to one or more neighboring transmission line of the plurality of transmission lines, and the spacings to one or more ground plane of the semiconductor package of the individual transmission line segments.

The one or more optimization algorithm may further be based on one or more optimization approaches known in the art.

Similar to what is described above with respect to FIG. 3 and FIG. 4, forming 804 the plurality of transmission lines in or on the substrate may comprise routing at least one of the plurality of transmission line segments perpendicular to a thickness direction of the substrate and routing at least one of the plurality of transmission line segments along the thickness direction of the substrate. Furthermore, forming 804 the plurality of transmission lines in or on the substrate may comprise forming a via between the respectively coupled second electrical contact and the at least one of the plurality of transmission line segments routed along the thickness direction of the substrate. Accordingly, a stepped transmission line transformer extending from the semiconductor die to the via may be formed.

For these examples, the method 800 may further comprise calculating lengths, widths, spacings to one or more neighboring transmission line section or via routed along the thickness directions of the substrate, spacings to ground planes in the substrate, and spacings to arrays of ground vias coupling respective ones of the ground planes for the via and the at least one of the plurality of transmission line segments routed along the thickness direction of the substrate based on target values for the respective first impedance and the respective second impedance. Accordingly, the dimensions and the placement of the transmission line segments may be adjusted such that the impedances provided by the respective transmission line match the target values for the respective first impedance and the respective second impedance.

The examples described herein may be summarized as follows:

An example (e.g., example 1) relates to a semiconductor package, comprising a semiconductor die arranged within a housing of the semiconductor package, the semiconductor die holding a radio frequency circuit and a plurality of first electrical contacts, a plurality of second electrical contacts formed on the exterior of the housing to enable external electrical contacting of the semiconductor package, and a plurality of transmission lines formed in or on a substrate of the semiconductor package, wherein each of the plurality of transmission lines couples a respective one of the plurality of first electrical contacts with a respective one of the plurality of second electrical contacts, wherein at least one of the plurality of transmission lines is formed as a stepped transmission line transformer comprising a plurality of transmission line segments exhibiting different impedances to match a respective first impedance of the respectively coupled first electrical contact to a respective second impedance at the respectively coupled second electrical contact, and wherein the plurality of transmission line segments exhibit different spacings to one or more ground plane of the semiconductor package.

Another example (e.g., example 2) relates to a previous example (e.g., example 1) or to any other example, further comprising that the plurality of transmission line segments exhibit at least one of different lengths, different widths and different spacings to one or more neighboring transmission line of the plurality of transmission lines.

Another example (e.g., example 3) relates to a previous example (e.g., one of the examples 1 or 2) or to any other example, further comprising that all of the plurality of transmission lines are formed as stepped transmission line transformers.

Another example (e.g., example 4) relates to a previous example (e.g., one of the examples 1 to 3) or to any other example, further comprising that the substrate is a multilayered substrate comprising at least a first layer, a second layer and a third layer, wherein a first ground plane is formed in the first layer, wherein the at least one of the plurality of transmission lines is formed in the second layer laterally adjacent to one or more second ground plane formed in the second layer, wherein a third ground plane is formed in the third layer, and wherein the second layer is arranged between the first layer and the third layer.

Another example (e.g., example 5) relates to a previous example (e.g., one of the examples 1 to 4) or to any other example, further comprising that at least one of the plurality of transmission line segments is routed perpendicular to a thickness direction of the substrate, and wherein at least one of the plurality of transmission line segments is routed along the thickness direction of the substrate.

Another example (e.g., example 6) relates to a previous example (e.g., example 5) or to any other example, further comprising that a via is coupled between the respectively coupled second electrical contact and the at least one of the plurality of transmission line segments routed along the thickness direction of the substrate.

Another example (e.g., example 7) relates to a previous example (e.g., example 6) or to any other example, further comprising that the substrate comprises two or more ground planes spaced apart from each other along the thickness direction of the substrate, wherein the two or more ground planes are coupled via a respective array of ground vias, and wherein the via and the at least one of the plurality of transmission line segments routed along the thickness direction of the substrate extend through the respective array of ground vias and a respective recess in the two or more ground planes.

Another example (e.g., example 8) relates to a previous example (e.g., one of the examples 1 to 7) or to any other example, further comprising that at least one of the plurality of first electrical contacts is coupled to input circuitry of the radio frequency circuit.

Another example (e.g., example 9) relates to a previous example (e.g., one of the examples 1 to 8) or to any other example, further comprising that at least one of the plurality of first electrical contacts is coupled to output circuitry of the radio frequency circuit.

Another example (e.g., example 10) relates to a previous example (e.g., one of the examples 1 to 9) or to any other example, further comprising that the respective second impedance is 50Ω.

Another example (e.g., example 11) relates to a previous example (e.g., one of the examples 1 to 9) or to any other example, further comprising that the respective second impedance is 100Ω.

Another example (e.g., example 12) relates to a previous example (e.g., one of the examples 1 to 11) or to any other example, further comprising that the plurality of transmission lines and the semiconductor die are formed as separate elements.

Another example (e.g., example 13) relates to a previous example (e.g., one of the examples 1 to 12) or to any other example, further comprising that the radio frequency circuit is one of a radio frequency transmitter, radio frequency receiver and a radio frequency transceiver.

An example (e.g., example 14) relates to a base station, comprising a printed circuit board, and a semiconductor package according to any one of examples 1 to 13, wherein the plurality of second electrical contacts are coupled to conductive traces formed in or on the printed circuit board.

Another example (e.g., example 15) relates to a previous example (e.g., example 14) or to any other example, further comprising at least one antenna coupled to semiconductor package via the conductive traces.

An example (e.g., example 16) relates to a mobile device, comprising a printed circuit board, and a semiconductor package according to any one of examples 1 to 13, wherein the plurality of second electrical contacts are coupled to conductive traces formed in or on the printed circuit board.

Another example (e.g., example 17) relates to a previous example (e.g., example 16) or to any other example, further comprising at least one antenna coupled to semiconductor package via the conductive traces.

An example (e.g., example 18) relates to a method for forming a semiconductor package, the method comprising placing a semiconductor die on a substrate of the semiconductor package, the semiconductor die comprising a radio frequency circuit and a plurality of first electrical contacts, forming a plurality of transmission lines in or on the substrate to couple a respective one of the plurality of first electrical contacts with a respective one of a plurality of second electrical contacts, wherein at least one of the plurality of transmission lines is formed as a stepped transmission line transformer comprising a plurality of transmission line segments exhibiting different impedances to match a respective first impedance of the respectively coupled first electrical contact to a respective second impedance at the respectively coupled second electrical contact, and wherein the plurality of transmission line segments are formed to exhibit different spacings to one or more ground plane of the semiconductor package, and forming a housing of the semiconductor package to include the second electrical contacts on the exterior of the housing to enable external electrical contacting of the semiconductor package.

Another example (e.g., example 19) relates to a previous example (e.g., example 18) or to any other example, further comprising that the plurality of transmission line segments are formed to exhibit at least one of different lengths, different widths and different spacings to one or more neighboring transmission line of the plurality of transmission lines.

Another example (e.g., example 20) relates to a previous example (e.g., one of the examples 18 or 19) or to any other example, further comprising that all of the plurality of transmission lines are formed as stepped transmission line transformers.

Another example (e.g., example 21) relates to a previous example (e.g., one of the examples 18 to 20) or to any other example, further comprising forming the substrate as a multilayered substrate comprising at least a first layer, a second layer and a third layer, wherein a first ground plane is formed in the first layer, wherein forming the plurality of transmission lines in or on the substrate comprises forming the at least one of the plurality of transmission lines in the second layer laterally adjacent to one or more second ground plane formed in the second layer, wherein a third ground plane is formed in the third layer, and wherein the second layer is arranged between the first layer and the third layer.

Another example (e.g., example 22) relates to a previous example (e.g., one of the examples 18 to 21) or to any other example, further comprising calculating lengths, widths, spacings to one or more neighboring transmission line of the plurality of transmission lines, and spacings to one or more ground plane of the semiconductor package for the plurality of transmission line segments based on target values for the respective first impedance and the respective second impedance.

Another example (e.g., example 23) relates to a previous example (e.g., example 22) or to any other example, further comprising that one or more optimization algorithm is used for calculating the lengths, the widths, the spacings to one or more neighboring transmission line of the plurality of transmission lines, and the spacings to one or more ground plane of the semiconductor package for the plurality of transmission line segments.

Another example (e.g., example 24) relates to a previous example (e.g., one of the examples 18 to 23) or to any other example, further comprising that forming the plurality of transmission lines in or on the substrate comprises routing at least one of the plurality of transmission line segments perpendicular to a thickness direction of the substrate, routing at least one of the plurality of transmission line segments along the thickness direction of the substrate, and forming a via between the respectively coupled second electrical contact and the at least one of the plurality of transmission line segments routed along the thickness direction of the substrate.

Another example (e.g., example 25) relates to a previous example (e.g., example 24) or to any other example, further comprising calculating lengths, widths, spacings to one or more neighboring transmission line section or via routed along the thickness directions of the substrate, spacings to ground planes in the substrate, and spacings to arrays of ground vias coupling respective ones of the ground planes for the via and the at least one of the plurality of transmission line segments routed along the thickness direction of the substrate based on target values for the respective first impedance and the respective second impedance.

The aspects and features described in relation to a particular one of the previous examples may also be combined with one or more of the further examples to replace an identical or similar feature of that further example or to additionally introduce the features into the further example.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. A semiconductor package, comprising:
   a semiconductor die arranged within a housing of the semiconductor package, the semiconductor die holding a radio frequency circuit and a plurality of first electrical contacts;
   a plurality of second electrical contacts formed on the exterior of the housing to enable external electrical contacting of the semiconductor package; and
   a plurality of transmission lines formed in or on a substrate of the semiconductor package, wherein each of the plurality of transmission lines couples a respective one of the plurality of first electrical contacts with a respective one of the plurality of second electrical contacts,
   wherein at least one of the plurality of transmission lines is formed as a stepped transmission line transformer comprising a plurality of transmission line segments exhibiting different impedances to match a respective first impedance of the respectively coupled first electrical contact to a respective second impedance at the respectively coupled second electrical contact, and wherein the plurality of transmission line segments exhibit different spacings to one or more ground plane in or on the substrate of the semiconductor package to tune a respective impedance of each transmission line segment.

2. The semiconductor package of claim 1, wherein the plurality of transmission line segments exhibit at least one of different lengths, different widths and different spacings to one or more neighboring transmission line of the plurality of transmission lines.

3. The semiconductor package of claim 1, wherein all of the plurality of transmission lines are formed as stepped transmission line transformers.

4. The semiconductor package of claim 1, wherein the substrate is a multilayered substrate comprising at least a first layer, a second layer and a third layer, wherein a first ground plane is formed in the first layer, wherein the at least one of the plurality of transmission lines is formed in the second layer laterally adjacent to one or more second ground plane formed in the second layer, wherein a third ground plane is formed in the third layer, and wherein the second layer is arranged between the first layer and the third layer.

5. The semiconductor package of claim 1, wherein at least one of the plurality of transmission line segments is routed perpendicular to a thickness direction of the substrate, and wherein at least one of the plurality of transmission line segments is routed along the thickness direction of the substrate.

6. The semiconductor package of claim 5, wherein a via is coupled between the respective second electrical contact and the at least one of the plurality of transmission line segments routed along the thickness direction of the substrate.

7. The semiconductor package of claim 6, wherein the substrate comprises two or more ground planes spaced apart from each other along the thickness direction of the substrate, wherein the two or more ground planes are coupled via a respective array of ground vias, and wherein the via and the at least one of the plurality of transmission line segments routed along the thickness direction of the substrate extend through the respective array of ground vias and a respective recess in the two or more ground planes.

8. The semiconductor package of claim 1, wherein at least one of the plurality of first electrical contacts is coupled to input circuitry of the radio frequency circuit.

9. The semiconductor package of claim 1, wherein at least one of the plurality of first electrical contacts is coupled to output circuitry of the radio frequency circuit.

10. The semiconductor package of claim 1, wherein the respective second impedance is 50 Ω.

11. The semiconductor package of claim 1, wherein the respective second impedance is 100 Ω.

12. The semiconductor package of claim 1, wherein the plurality of transmission lines and the semiconductor die are formed as separate elements.

13. The semiconductor package of claim 1, wherein the radio frequency circuit is one of a radio frequency transmitter, radio frequency receiver and a radio frequency transceiver.

14. A base station, comprising:
   a printed circuit board; and
   a semiconductor package according to claim 1,
   wherein the plurality of second electrical contacts are coupled to conductive traces formed in or on the printed circuit board.

15. The base station of claim 14, further comprising at least one antenna coupled to semiconductor package via the conductive traces.

16. A mobile device, comprising:
   a printed circuit board; and
   a semiconductor package according to claim 1,
   wherein the plurality of second electrical contacts are coupled to conductive traces formed in or on the printed circuit board.

17. The mobile device of claim 16, further comprising at least one antenna coupled to semiconductor package via the conductive traces.

18. A method for forming a semiconductor package, the method comprising:
   placing a semiconductor die on a substrate of the semiconductor package, the semiconductor die comprising a radio frequency circuit and a plurality of first electrical contacts;
   forming a plurality of transmission lines in or on the substrate to couple a respective one of the plurality of first electrical contacts with a respective one of a plurality of second electrical contacts, wherein at least one of the plurality of transmission lines is formed as a stepped transmission line transformer comprising a plurality of transmission line segments exhibiting different impedances to match a respective first impedance of the respectively coupled first electrical contact to a respective second impedance at the respectively coupled second electrical contact, and wherein the plurality of transmission line segments are formed to exhibit different spacings to one or more ground plane in or on the substrate of the semiconductor package to tune a respective impedance of each transmission line segment; and
   forming a housing of the semiconductor package to include the second electrical contacts on the exterior of the housing to enable external electrical contacting of the semiconductor package.

19. The method of claim 18, wherein the plurality of transmission line segments are formed to exhibit at least one of different lengths, different widths and different spacings to one or more neighboring transmission line of the plurality of transmission lines.

20. The method of claim 18, wherein all of the plurality of transmission lines are formed as stepped transmission line transformers.

21. The method of claim 18, further comprising:

forming the substrate as a multilayered substrate comprising at least a first layer, a second layer and a third layer, wherein a first ground plane is formed in the first layer, wherein forming the plurality of transmission lines in or on the substrate comprises forming the at least one of the plurality of transmission lines in the second layer laterally adjacent to one or more second ground plane formed in the second layer, wherein a third ground plane is formed in the third layer, and wherein the second layer is arranged between the first layer and the third layer.

22. The method of claim 18, further comprising:

calculating lengths, widths, spacings to one or more neighboring transmission line of the plurality of transmission lines, and spacings to one or more ground plane of the semiconductor package for the plurality of transmission line segments based on target values for the respective first impedance and the respective second impedance.

23. The method of claim 22, wherein one or more optimization algorithm is used for calculating the lengths, the widths, the spacings to one or more neighboring transmission line of the plurality of transmission lines, and the spacings to one or more ground plane of the semiconductor package for the plurality of transmission line segments.

24. The method of claim 18, wherein forming the plurality of transmission lines in or on the substrate comprises:

routing at least one of the plurality of transmission line segments perpendicular to a thickness direction of the substrate;

routing at least one of the plurality of transmission line segments along the thickness direction of the substrate; and forming a via between the respectively coupled second electrical contact and the at least one of the plurality of transmission line segments routed along the thickness direction of the substrate.

25. The method of claim 24, further comprising:

calculating lengths, widths, spacings to one or more neighboring transmission line section or via routed along the thickness directions of the substrate, spacings to ground planes in the substrate, and spacings to arrays of ground vias coupling respective ones of the ground planes for the via and the at least one of the plurality of transmission line segments routed along the thickness direction of the substrate based on target values for the respective first impedance and the respective second impedance.

* * * * *